United States Patent [19]
Kenney et al.

[11] Patent Number: 5,384,281
[45] Date of Patent: Jan. 24, 1995

[54] NON-CONFORMAL AND OXIDIZABLE ETCH STOPS FOR SUBMICRON FEATURES

[75] Inventors: Donald M. Kenney, Shelburne; Stephen E. Luce, Underhill, both of Vt.

[73] Assignee: International Business Machines Corporation, Armonk, N.Y.

[21] Appl. No.: 997,847

[22] Filed: Dec. 29, 1992

[51] Int. Cl.⁶ .............................................. H01L 21/44
[52] U.S. Cl. ..................................... 437/189; 437/193
[58] Field of Search .................................. 437/189, 193

[56] References Cited

U.S. PATENT DOCUMENTS

| | | | |
|---|---|---|---|
| 4,724,060 | 2/1988 | Sakata et al. | 204/298 |
| 4,824,544 | 4/1989 | Mikalesen et al. | 204/298 |
| 4,944,682 | 7/1990 | Cronin et al. | 437/192 |
| 4,966,870 | 10/1990 | Barber et al. | 437/228 |
| 5,171,412 | 12/1992 | Talieh et al. | |
| 5,187,119 | 2/1993 | Cech et al. | |

OTHER PUBLICATIONS

C. G. Jambotkar and P. P. Wang, "Compact Dynamic Random-Access Memory Cell", *IBM Technical Disclosure Bulletin*, 23, No. 7A (1980).

Anonymous, "Borderless Diffusion Contact Process for Array Structures", *IBM Research Disclosure*, No. 282 (1987).

Anonymous, "Contact Hole Etching Process", *IBM Research Disclosure*, No. 300 (1989).

*Primary Examiner*—Olik Chaudhuri
*Assistant Examiner*—C. Everhart
*Attorney, Agent, or Firm*—Heslin & Rothenberg

[57] ABSTRACT

A process for etching narrow features, particularly submicron borderless contacts, in a semiconductor substrate is disclosed. The process comprises depositing, by an orientation-sensitive technique, film which will act as an etch stop. The film is significantly thicker on horizontal surfaces than on vertical. A second layer is deposited and then etched using the first film as an etch stop. In one embodiment the etch stop is composed of an oxidizable material.

15 Claims, 3 Drawing Sheets

NON-CONFORMAL AND OXIDIZABLE ETCH STOPS FOR SUBMICRON FEATURES

FIELD OF THE INVENTION

The invention relates to processes for the controlled etching of narrow features, such as submicron borderless contacts, in semiconductor substrates. The process employs non-conformal deposition of etch stops, particularly oxidizable etch stops.

BACKGROUND OF THE INVENTION

Traditionally, in the manufacture of integrated circuits, the contacts to polycrystalline silicon (poly-Si) and metal structures, and to diffusion regions, are designed such that a border region is provided surrounding the region where the contact is to be formed. Borders around the contacts are used primarily to ensure that under worst-case conditions, the contact openings will never extend beyond the structure or regions with which contact is to be made. If the border is not used, the contacts, due to normal process variations, may fall partially on the desired structure or regions and partially over adjacent structures or regions, thereby forming undesired connections.

While borders around contact windows ensure proper registration of the contacts and protection of the underlying conductive structures, they have the undesirable effect of limiting the maximum number of integrated circuits that can be packed in a given area. This limitation can be illustrated by the following example. If a standard bordered process has a one micron minimum dimension contact and a one micron minimum dimension poly-Si line, a one-half micron border must be placed around each contact. As a result, the poly-Si pad over which the contacts are placed must be approximately two microns in each dimension, or four square microns. In contrast a borderless process would not require any borders around the poly-Si contact, and a minimum dimension poly-Si line, in this case a one-half micron poly-Si line, could be used to make contact. As a result, the borderless technology would save approximately three square microns per contact structure. A borderless contact process allows an increased level of circuit integration, and hence an increased IC chip density.

Various techniques have been developed for forming borderless contacts, as disclosed in U.S. Pat. No. 4,944,682 (Cronin et al.), U.S. Pat. No. 4,966,870 (Barber et al.), and *Research Disclosure* #282, p A-144 (1987). The borderless contact processes described in these references involve depositing a conformal coating of material on a substrate so as to overlie pre-existing topography (e.g., poly-Si interconnect lines or an FET gate stack) and then depositing a second relatively void-free layer of material on top of the first layer. An opening for the borderless contact is formed in the second layer using an etchant that etches the second layer faster than the first layer, with the etch process generally being terminated when the opening extends entirely through the second layer to the first layer. Thus, the first layer serves as an etch stop for the etching process used to form the opening in the second layer. Then, a second etchant is used to extend the opening through the first layer to the selected underlying structure where contact is to be made.

For borderless contact processes of the type disclosed by Cronin et al. and Barber et al. to function effectively, the etching process used to form the opening in the second layer must be highly selective between the two layers. That is, the etching process used to etch the opening in the second layer should etch the second layer at a significantly faster rate than the first layer, with etch rate ratios (ERRs) in the range of at least 40:1 being preferred. Unfortunately, the etch selectivity of known etchants that may be used to etch the first and second layers is often not as great as needed. As a result, slight over etching of the second layer can result in the etching of an opening in the first layer (which typically is not intended to be etched). Thus, a need exists for a borderless contact process involving depositions and etching processes that together provide a higher etch selectivity than is typically available with known borderless contact processes.

The problem of selectivity becomes especially acute when submicron connections are to be created inside trenches of small dimension. Consider two closely spaced transistor gate electrodes (elements 3 and 4 in FIG. 1) which are to have contacts located between the gate electrodes. During processing, the (vertical) contact etch will be stopped by etch stop layer 9. A thick insulator layer 10A, 10B and 10C made of glass or similar material is laid over the whole area and the contact holes 17 and 19 are patterned and then etched through the glass to the etch stop layer 9. The dimensions of the contacts will thus be limited by the thickness of the etch stop layer 9 on the sidewall spacers 13 and 15. In particular, for FIG. 1, the etch stop layer 9 can be no thicker than the distance d from the lower edge of the insulator layer portion 10B to the structure 8 under the etch stop for contact to the diffusion 1. The thinner the etch stop, the more closely contacts can be packed. Unfortunately the chances of circuit failure due to breaking through the etch stop are thereby increased. The thicker the etch stop, the less chance of circuit failure due to breaking through the etch stop but the larger the dimensions associated with the contact.

There is thus a need for a process that can produce very small dimensions together with high protection of the bottom of the trench from breakthrough.

A second problem can be addressed when the etch stop layer is oxidizable. This will be seen in more detail below, but in broad terms, the problem arises either (1) when the etch stop layer is optimally deposited at a point in the fabrication process at which its physical/chemical properties as an etch stop and its functional/electrical properties in a circuit are incompatible, or (2) when, in a subsequent step, the etch stop layer will, itself, have to be etched in the presence of a material having a similar etch rate. In such instances oxidizable materials can be used as etch stops and after their function as etch stops is complete, they can be converted to more advantageous materials by oxidation. Poly-Si is particularly well suited for use as the etch stop layer 9 when the second layer is boron phosphorus silicate glass (BPSG) because the etch ratio between BPSG and poly-Si is good and the poly-Si can be subsequently oxidized to provide a good dielectric ($SiO_2$) which can be etched with high selectivity relative to an underlying silicon layer.

SUMMARY OF THE INVENTION

It is an object of the invention to provide a low failure rate process for the fabrication of very dense integrated circuits.

It is a further object to provide a borderless contact of minimal dimensions.

It is a further object to provide a means for stopping directional etching on a horizontal surface in a trench while at the same time minimally increasing the space requirement for structures in the trench.

These and other objects, features and advantages are provided by the present invention, which in one aspect relates to a process for etching narrow features in a semiconductor substrate comprising the steps of:

(a) depositing, by an orientation-sensitive deposition technique, a first film in a plurality of cavities in a semiconductor substrate, whereby said first film is preferentially deposited on surfaces parallel to a long axis of said semiconductor substrate;

(b) depositing a second film over the first film, said second film comprising a material that can be selectively etched in the presence of said first film; and (c) directionally etching the second film using the first film as an etch stop.

The first film may then be removed from the cavities.

Throughout the following disclosure and claims, surfaces parallel to a surface of the substrate on which the structure is being built will be called horizontal surfaces; surfaces perpendicular to the surface will be called vertical. The two terms do not carry any implication as to the orientation of the substrate or deposition with respect to gravity, although the substrates are shown in that orientation if the FIGs. As also used herein, the "long axis" of the substrate refers to an axis along the surface of the substrate on which structure is built.

Preferred methods for obtaining such depositions are collimated sputtering, evaporation and electron-cyclotron resonance deposition, particularly collimated sputtering. Preferred first films are amorphous silicon, poly-Si and silicon nitride, and a preferred second film is boron phosphorus silicate glass. The second film may be etched by a reactive ion etching (RIE) etching process using, for example, 5% oxygen in $CF_4$.

In another aspect the invention relates to a process for etching narrow features in a semiconductor substrate comprising the steps of:

(a) depositing, by an orientation-sensitive deposition method, an oxidizable first film on at least a portion of a semiconductor substrate. That portion of the semiconductor substrate must have a non-oxidizable surface. The oxidizable film is deposited preferentially on horizontal surfaces;

(b) depositing a second film over the first film. The second film comprises a material which can be selectively etched in the presence of the first film;

(c) patterning the second film with a plurality of openings extending to the first film; and (d) removing the first film in the openings.

The removal of the first film in the opening leaves a portion of the first film under the residual portions of the second film where, in some cases, its electrical properties would be a problem. In these cases the first film may be oxidized under the second film. The preferred methods and materials are as described above for the first aspect of the invention. Commonly the narrow feature resulting from the process of the invention will be a window for a borderless contact.

DETAILED DESCRIPTION OF THE INVENTION

Figure 1:
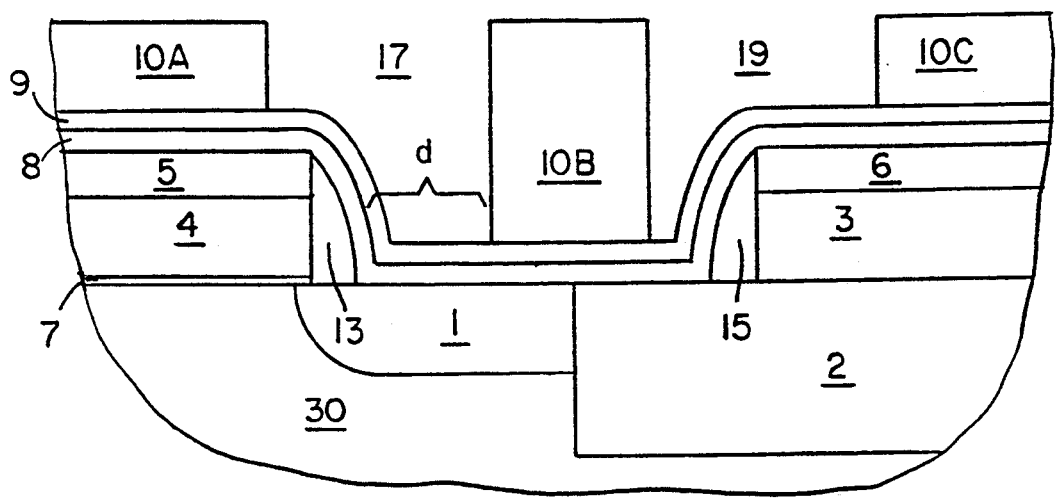
FIG. 1 is a cross section of a semiconductor structure which does not incorporate all the features of the invention.

The present invention provides a solution to the problem of providing an etch stop that has the maximum stopping power for a vertical etch but takes up as little horizontal space as possible. On a flat surface the problem is readily solved by depositing a relatively thick etch stop layer. In a trench the problem is not so readily solved: the thick layer will narrow the distance between the walls and thereby decrease the usable floor space. The width of the trench must always be more than twice the thickness of the stop layer.

According to the process of the invention the etch stop layer is deposited by an orientation-sensitive technique. We have found that by using collimated sputtering, an etch stop of an oxidizable material such as amorphous silicon or a non-oxidizable material such as silicon nitride can be deposited so that the film is significantly thicker on the floor of a trench, i.e. parallel to the long axis of the wafer or substrate, than it is on the walls of the trench, i.e. perpendicular to the long axis. By this process one can deposit an etch stop concentrated where it needs to be.

Although we have employed collimated sputtering in examples of our process, any orientation-sensitive or directional deposition technique could be employed. Other known directional deposition technologies include, for example, evaporation and electron cyclotron resonance (ECR) deposition. Collimated sputtering is described in U.S. Pat. No. 4,824,544 which is incorporated herein by reference. An alternative directional sputtering process is described in U.S. Pat. No. 4,724,060. The essence of all these processes is that a directed "beam" of the material of which the film will be composed impinges on a target, which for the purpose of the present invention is oriented normal to the beam. The film is thereby non-conformally deposited, predominantly on horizontal surfaces. When a poly-Si target is sputtered, the resulting film is amorphous silicon.

In the example below, amorphous silicon is non-conformally deposited. Amorphous silicon is particularly well suited to the purpose of the invention because it can be deposited by sputtering, it has an adequate etch ratio vis-á-vis boron phosphorus silicate glass (BPSG), which can be the second film layer, and it can be oxidized by processes well known in the art. The oxidation is advantageous because it allows the conversion of the etch stop to a good dielectric so that it need not be removed in certain regions of the circuit. It also allows the etch ratio between an underlying layer and the etch stop to be altered when such alteration is advantageous. Other materials that can be sputtered, that have good etch ratios vis-á-vis other exposed structures, and that can be oxidized are also preferred in the inventive process, but oxidizability is not an absolute requirement for the broad aspect of the invention; materials that can be deposited by collimated sputtering and that have favorable etch ratios vs other exposed structures can be used when oxidizability is not needed. Silicon nitride may be employed in this context. Metals may also be used to advantage in some applications. They can be sputtered, they can have good etch ratios relative to adjacent structures and their electrical properties can be radically altered by oxidation (metal to dielectric).

Typical collimated sputtering conditions of the type described in U.S. Pat. No. 4,824,544 are suitable for depositing the non-conformal layer. The rate of deposition by collimated sputtering according to this process in inversely proportional to non-conformality. That is, the higher the deposition rate, the lower the differential between vertical and horizontal thickness. Thus, for applications in which sidewall clearance or trench dimensions are critical concerns, the deposition rate will be kept low; for applications in which sidewall clearance is less critical, a higher deposition rate can be used.

RIE etch conditions that provide a usable ratio between amorphous silicon or poly-Si and BPSG are well known in the art. Typically, an ambient of $CHF_3$ and oxygen will be used, although we have found that 5% in $CF_4$ at room temperature and 80 mTorr provides good selectivity.

Amorphous silicon or poly-Si may be oxidized at 800° C. in a steam ambient at 10 atm. When the etch stop is to be oxidized it is usually desirable that the etch stop be laid down over a non-oxidizable surface that can serve as a barrier to oxidation of underlying materials. Silicon nitride, aluminum oxide and similar materials make good non-oxidizable surfaces. After oxidation, the oxidation barrier can be removed by conventional RIE etching.

The use of the process of the invention for the fabrication of windows for borderless contacts is shown in FIGS. 2 to 7.

Figure 2:
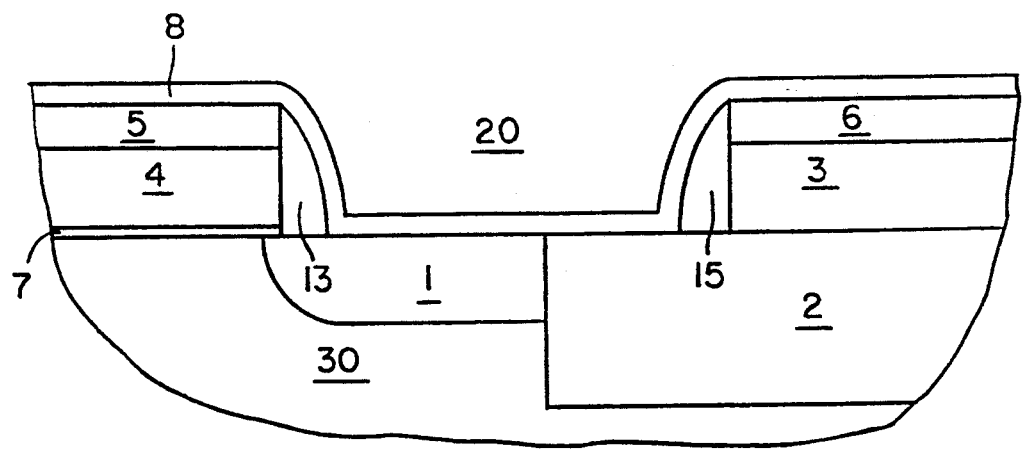
FIGS. 2 through 7 are cross sections of semiconductor structures illustrating a process sequence according to the invention.

FIG. 2 shows a typical semiconductor fabrication at the stage of processing wherein a silicon substrate 30 has been provided with a diffusion or doped region 1 and conducting layers 3 and 4, preferably of poly-Si, which will form gate electrodes in the semiconductor devices which are to be formed on the silicon substrate. The conducting layers have electrically insulating layers 5 and 6 capping them and sidewall spacers 13 and 15 covering their sidewalls. The sidewall spacers are typically oxide. A shallow trench isolation 2 isolates the two adjacent devices on the substrate. Poly-Si gate electrode 4 is separated from substrate 30 and diffusion 1 by gate oxide 7 which can be silicon oxide or silicon nitride or a sandwich of the two. A passivation layer of silicon nitride 8 is conformally deposited over the structure. A pair of borderless contacts separated by an insulator will be placed in the trench 20. The left contact will contact diffusion and the right contact will contact gate electrode 3.

Figure 3:
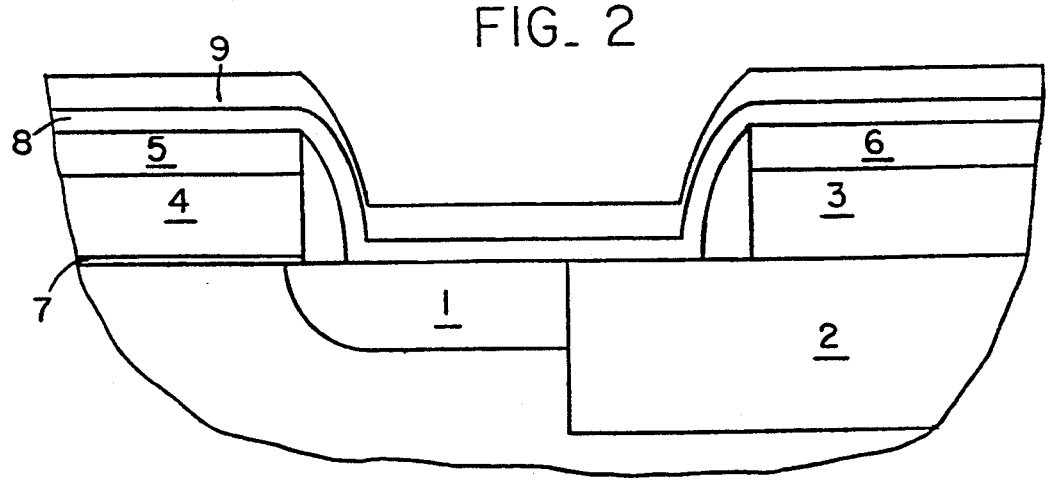

In FIG. 3 a layer of a first material 9 is directionally deposited over the passivation layer 8 in such a manner that it is thicker in the bottom of the trench than on the side walls. In this embodiment the layer 9 is amorphous silicon deposited by collimated sputtering. It has been universally deposited, but for other applications it could be patterned so that only the area of concern is covered. Its thickness in this case is 20 to 50 nm on the bottom horizontal surface.

Figure 4:
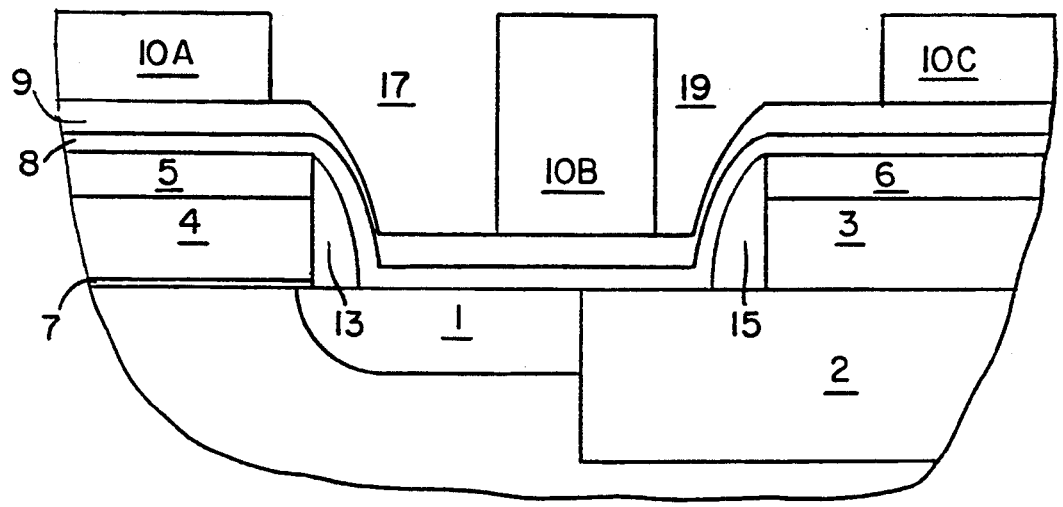

In FIG. 4 a second material 10, BPSG, has been deposited thickly (500 nm to 1000 nm) over the structure and reflowed under non-oxidizing conditions to planarize its surface. Other materials and techniques could be used to achieve the same purpose. Spin-on glass would also provide a planar surface, as would other dielectric materials which could be deposited and then chemical-mechanical polished to planarize. A planar surface is often desirable because the resolution of subsequent photolithography will be improved, but it is not necessary to the practice of the invention.

A photoresist is deposited on top of the BPSG, patterned by photolithography and the BPSG is RIE etched through the resulting contact windows using the layer 9 as an etch stop. This yields two contact holes 17 and 19 separated by a portion 10B of the BPSG layer. Residual BPSG is seen as layers 10A, 10B and 10C after the removal of the photoresist layer. The alignment of the mask to produce the contact holes can be less than perfect as long as the contact on the right side can be cut through to contact the gate electrode 3 and the left can be cut through to only the diffusion 1. The thinness of the layer 9 on the side wall allows a certain degree of latitude in the placement of the holes 17 and 19. The thicker the layer of 9 on the side wall, the more precise the alignment of the holes 17 and 19 must be or the larger the trench must be.

Figure 5:
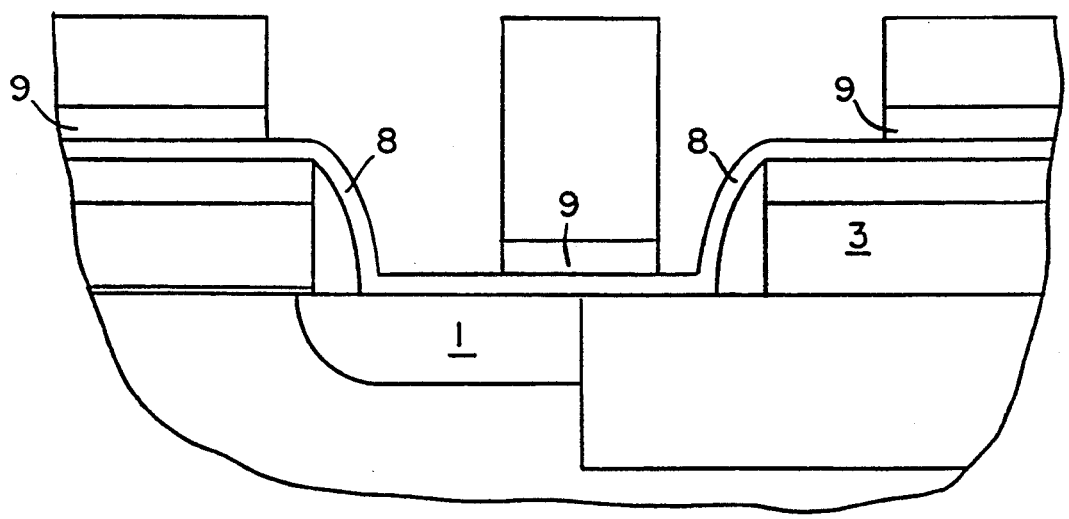
Figure 6:
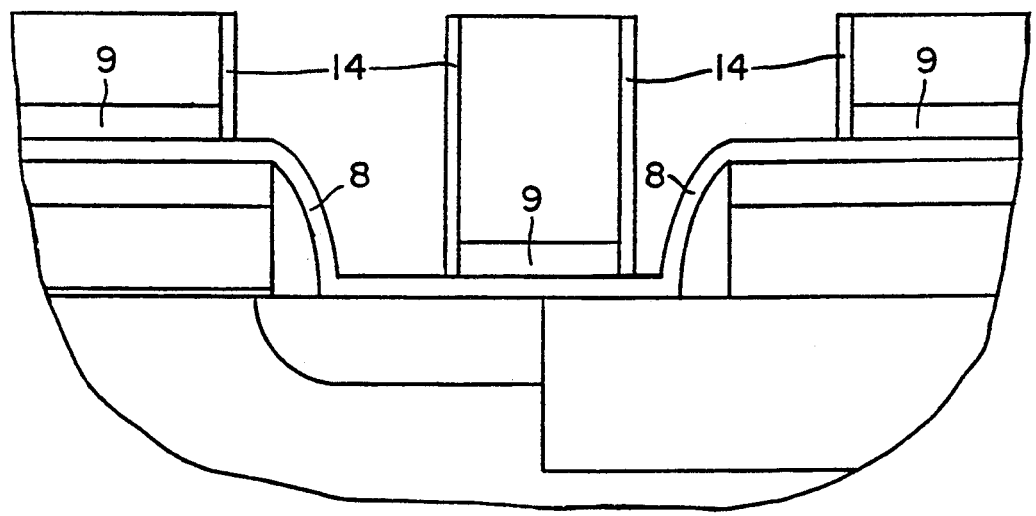

In FIG. 5 the amorphous silicon layer 9 has been RIE etched from the bottom of the trench using the BPSG as a mask and the passivation layer 8 as an etch stop. The etch ratio need not be large because the layers are of comparable thickness on the bottom of the trench. A liner for the contact holes is created by conformally depositing a thin layer 14 of rigid, high-melting material such as silicon nitride or silicon dioxide/silicon nitride composite and RIE etching it from the horizontal surfaces (FIG. 6). This is done to stabilize the BPSG during reflow (below). A liner is not required when no reflow is done.

Figure 7:
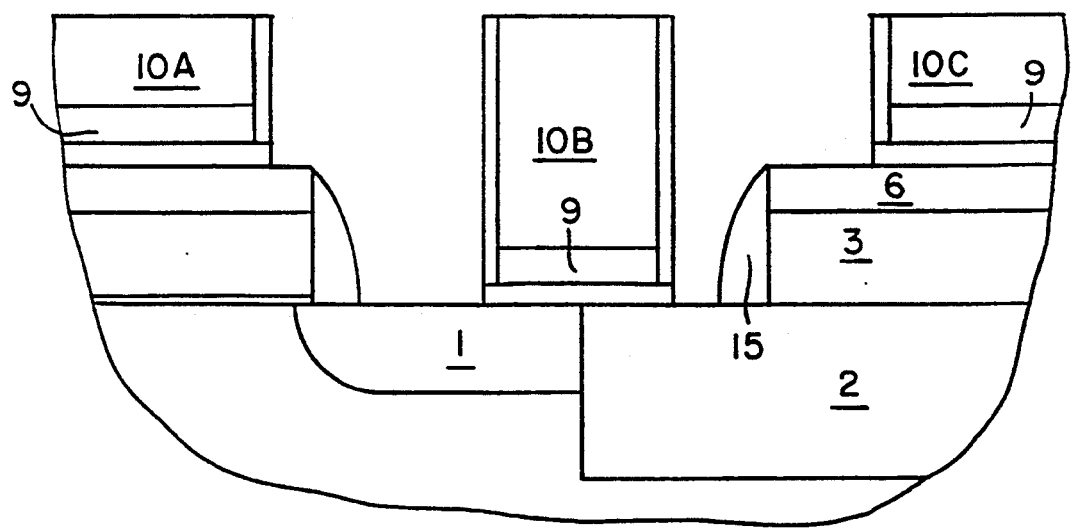

In FIG. 7 the substrate is exposed to steam at 800° C. and 10 atm to reflow the BPSG and to oxidize the etch stop layer 9 to silicon dioxide. The passivation layer 8 is then RIE etched from the bottom of both holes, stopping on silicon or silicon dioxide surfaces. Subsequent masking and etching by conventional means of the cap oxide 6 provides access to the gate electrode 3. Conductive material, such as tungsten, is ultimately deposited in the contact holes to complete the creation of the adjacent contacts. This processing is well known in the art and incidental to the practice of the invention.

While the invention has been particularly shown and described with reference to preferred embodiments thereof, it will be understood by those skilled in the art that other changes in form and details may be made therein without departing from the spirit and scope of the invention.

We claim:

1. A process for etching narrow features in a semiconductor substrate comprising the steps of:
   (a) depositing, by an orientation-sensitive deposition technique, a first film in a plurality of cavities in a semiconductor substrate, whereby said first film is deposited preferentially on surfaces parallel to a long axis of said semiconductor substrate;
   (b) depositing a second film over said first film, said second film comprising a material that can be selectively etched in the presence of said first film;
   (c) directionally etching said second film using said first film as an etch stop; and
   (d) removing said first film from said cavities.

2. A process according to claim 1 wherein said first film is deposited on surfaces perpendicular to a long axis to a thickness which is less than one-half the thickness deposited on surfaces parallel to a long axis.

3. A process according to claim 1 wherein said first film is deposited by collimated sputtering.

4. A process for etching narrow features in a semiconductor substrate comprising the steps of:
   (a) depositing, by an orientation-sensitive deposition technique, a first film in a plurality of cavities in a semiconductor substrate, whereby said first film is deposited preferentially on surfaces parallel to a long axis of said semiconductor substrate;
   (b) depositing a second film over said first film, said second film comprising a material that can be selectively etched in the presence of said first film; and
   (c) directionally etching said second film using said first film as an etch stop wherein said first film is chosen from the group consisting of amorphous silicon and polycrystalline silicon.

5. A process according to claim 4 wherein said second film is boron phosphorus silicate glass.

6. A process according to claim 5 wherein said second film is RIE etched using 5% oxygen in $CF_4$.

7. A process for etching narrow features in a semiconductor substrate comprising the steps of:
   (a) depositing, by an orientation-sensitive deposition technique, a first film in a plurality of cavities in a semiconductor substrate, whereby said first film is deposited preferentially on surfaces parallel to a long axis of said semiconductor substrate;
   (b) depositing a second film over said first film, said second film comprising a material that can be selectively etched in the presence of said first film; and
   (c) directionally etching said second film using said first film as an etch stop, wherein said first film is silicon nitride.

8. A process for etching narrow features in a semiconductor substrate comprising the steps of:
   (a) depositing, by an orientation-sensitive deposition technique, an oxidizable first film on at least a portion of a semiconductor substrate, said portion of said semiconductor substrate having a non-oxidizable surface, whereby said oxidizable film is deposited preferentially on surfaces parallel to a long axis of said semiconductor substrate;
   (b) depositing a second film over said first film, said second film comprising a material which can be selectively etched in the presence of said first film;
   (c) patterning said second film with a plurality of openings extending to said first film; and
   (d) removing said first film in said openings.

9. A process according to claim 8 further comprising a step of oxidizing said first film under said second film.

10. A process according to claim 8 wherein said oxidizable first film is deposited on surfaces perpendicular to said long axis to a thickness which is less than half the thickness parallel to said long axis.

11. A process according to claim 8 wherein said orientation-sensitive deposition method is selected from the group consisting of collimated sputtering, evaporation and electron-cyclotron resonance deposition.

12. A process according to claim 11 wherein said deposition method is collimated sputtering.

13. A process according to claim 8 wherein said first film is selected from the group consisting of amorphous silicon and polycrystalline silicon.

14. A process according to claim 8 wherein said second film is boron phosphorus silicate glass.

15. A process according to claim 8 wherein said narrow feature is a window for a borderless contact.

* * * * *